US006300765B1

(12) United States Patent
Chen

(10) Patent No.: US 6,300,765 B1
(45) Date of Patent: Oct. 9, 2001

(54) SYSTEM, IC CHIP, ON-CHIP TEST STRUCTURE, AND CORRESPONDING METHOD FOR MODELING ONE OR MORE TARGET INTERCONNECT CAPACITANCES

(75) Inventor: James C. Chen, Foster City, CA (US)

(73) Assignee: BTA Technology, Inc., San Jose, CA (US)

( * ) Notice: Subject to any disclaimer, the term of this patent is extended or adjusted under 35 U.S.C. 154(b) by 0 days.

(21) Appl. No.: 09/246,469

(22) Filed: Feb. 9, 1999

(51) Int. Cl.[7] ..................................................... G01R 31/08
(52) U.S. Cl. ........................................ 324/519; 324/158.1
(58) Field of Search ................................ 324/158.1, 763, 324/719, 519, 520, 765; 714/724

(56) References Cited

PUBLICATIONS

Chenming Hu; An on chip interconnect capacitance characterization method with sub femto fard resolution (IEEE vol. 11, No. 2, May 1998.*
James C. Chen et al, An on chip attofarad interconnect charge based capacitance measurement techique (IEEE).*
Bruce W. McGaughy et al, A simple method for on chip, sub femto farad interconnect Capacitance measurement (IEEE vol. 18 No. 1, Jan. 1997).*
Khalkhal, A., et al., "On–Chip Measurement of Interconnect Capacitances in a CMOS Process", *Proc. IEEE*, pp. 145–149 (1995).
Gaston, G. J., et al., "Efficient extraction of metal parasitic capacitances", *Proc. IEEE*, vol. 8:157–160 (Mar. 1995).
Kortekaas, C., "On–Chip Quasi–static Floating–gate Capacitance Measurement Method", *Proc. IEEE*, vol. 3:109–113 (Mar. 1990).
Chen, J. C., et al., "An On–Chip, Attofarad Interconnect Charge–based Capacitance Measurement (CBCM) Technique", International Electronic Devices Meeting (IEDM) Conference (Dec. 1996).
Laquai, B., et al., "A New Method and Test Structure for Easy Determination of Femto–Farad On–Chip Capacitances in a MOS Process", *Proc. IEEE*, vol. 5:62–66 (Mar. 1992).

* cited by examiner

*Primary Examiner*—Safet Metjahic
*Assistant Examiner*—Jimmy Nguyen
(74) *Attorney, Agent, or Firm*—Steven F. Caserza; Flehr Hohbach Test Albritton & Herbert LLP

(57) ABSTRACT

A system, an IC chip, a test structure formed on the IC chip, and a corresponding method for modeling one or more target interconnect capacitances is disclosed. The test structure comprises an interconnect configuration comprising a test interconnect and one or more target interconnects. The interconnect configuration has, for each target interconnect, a corresponding target interconnect capacitance between the test interconnect and the target interconnect. The test structure also comprises a test interconnect charging circuit connected to the test interconnect. The test interconnect charging circuit is configured to place a test charge on the test interconnect. The test structure further comprises one or more target interconnect charging circuits. Each target interconnect charging circuit is connected to a corresponding target interconnect. Each target interconnect charging circuit is configured to draw a target interconnect charging current from the corresponding target interconnect in response to the test charge. This places an opposite charge on the corresponding target interconnect that is induced by the corresponding target interconnect capacitance. As a result, a measurement of the corresponding target interconnect capacitance may be computed by making a measurement of the target interconnect charging current with a current meter of the system.

25 Claims, 4 Drawing Sheets

SYSTEM, IC CHIP, ON-CHIP TEST STRUCTURE, AND CORRESPONDING METHOD FOR MODELING ONE OR MORE TARGET INTERCONNECT CAPACITANCES

BRIEF DESCRIPTION OF THE INVENTION

The present invention relates generally to techniques of extracting parameter measurements for circuit simulations. In particular, it pertains to an improved IC chip, on-chip test structure, and corresponding method for modeling one or more interconnect capacitances. Precise measurements of the interconnect capacitances can be made with the test structure. These measurements are then used to accurately extract interconnect parameter measurements for circuit simulations.

BACKGROUND OF THE INVENTION

As integrated circuits become increasingly laden with metal or polysilicon interconnects, the resulting interconnect capacitances are rapidly becoming a bottleneck in the design of faster ICs. It has therefore become very important to model these capacitances in order to accurately simulate the performance of ICs. However, it is difficult to make measurements of modeled interconnect capacitances with high accuracy and resolution. As a result, the extraction of interconnect parameters using these measurements is often not precise. This causes circuit simulations performed without correctly extracted interconnect parameters to be inaccurate and unreliable.

In the past, on-chip test structures have been used in attempts to model interconnect capacitances with higher accuracy and resolution. However, many of these test structures suffer from significant deficiencies which make them inefficient and/or result in interconnect capacitance measurements made with them being inaccurate and/or having low resolution.

For example, the on-chip test structures disclosed in Khalkhal, A., et al., *On-Chip Measurement of Interconnect Capacitances in a CMOS Process*, Proc. IEEE 1995 Int. Conf. on Microelectronic Test Structures, vol. 8 (March 1995), Gaston, G. J., et al., *Efficient Extraction of Metal Parasitic Capacitances*, Proc. IEEE 1995 Int. Conf. on Microelectronic Test Structures, vol. 8 (March 1995), Shyu, J. B., et al., *Random Effects in Matched MOS Capacitors and Current Sources*, IEEE Journal of Solid State Circuits, vol. sc-19(6):948–955 (December 1984), Kortekaas, C., *On-Chip Quasi-Static Floating-Gate Capacitance Measurement Method*, Proc. IEEE 1990 Int. Conf. on Microelectronic Test Structures, vol. 3 (March 1990), and Laquai, B., et al., *A New Method and Test Structure for Easy Determination of Femto-Farad On-Chip Capacitances in a MOS Process*, Proc. IEEE 1992 Int. Conf. on Microelectronic Test Structures, vol. 5:62–66 (March 1992), require a reference capacitor and/or a complicated test structure design and measurement set-up. Moreover, these test structures provide only picofarad or femptofarad resolution and occupy a large chip area.

An improved test structure with attofared resolution is disclosed in Chen, J. C., et al., *An On-Chip, Attofared Interconnect Charge-Based Capacitance Measurement (CBCM) Technique*, Proc. of IEDM 1996, pp. 69–72. This test structure has a reference structure and a target structure. The reference structure is identical to the target structure except that the interconnect configuration of the reference structure does not include the target interconnect capacitance to be modeled and measured. The difference in current between charging (or discharging) the total capacitances of the reference and target structures is then used to compute a measurement of the target interconnect capacitance.

One problem with such a test structure is that it requires a corresponding reference structure for the target structure. This obviously increases the chip area of the entire test structure.

Another problem is that the test structure can only be used to measure one target interconnect capacitance. Thus, if an IC designed by an IC designer has a complicated interconnect configuration with many interconnect capacitances in close proximity to each other, a separate test structure is required for each of these interconnect capacitances. This increases the chip area of the IC chip on which all of the test structures are formed.

Conversely, if only one test structure is used for a complicated interconnect configuration, only one lumped interconnect capacitance can be modeled and measured. This means that the specific interconnect capacitances that comprise the lumped capacitance cannot be separately modeled and measured.

In view of the foregoing, it would be highly desirable to provide an improved test structure that has small chip area and is capable of separately modeling all of the specific interconnect capacitances in a complicated interconnect configuration. Ideally, the interconnect capacitance measurements made with such a test structure could be used to extract interconnect parameters for accurately simulating ICs.

SUMMARY OF THE INVENTION

In summary, the present invention comprises a system, an IC chip, a test structure formed on the IC chip, and a corresponding method for modeling one or more target interconnect capacitances.

The test structure comprises an interconnect configuration formed on the IC chip. The interconnect configuration comprises a test interconnect and one or more target interconnects. The interconnect configuration has, for each target interconnect, a corresponding target interconnect capacitance between the test interconnect and the target interconnect.

The test structure also comprises a test interconnect charging circuit formed on the IC chip and connected to the test interconnect. The test interconnect charging circuit is configured to place a test charge on the test interconnect.

The test structure further comprises one or more target interconnect charging circuits. Each target interconnect charging circuit is formed on the IC chip and connected to a corresponding target interconnect. Each target interconnect charging circuit is configured to draw a target interconnect charging current from the corresponding target interconnect in response to the test charge. This places an opposite charge on the corresponding target interconnect that is induced by the corresponding target interconnect capacitance.

A measurement of the target interconnect charging current can be made with a current meter of the system. From this measurement, a measurement of the corresponding target interconnect capacitance may be computed.

DETAILED DESCRIPTION OF THE INVENTION

Figure 1:
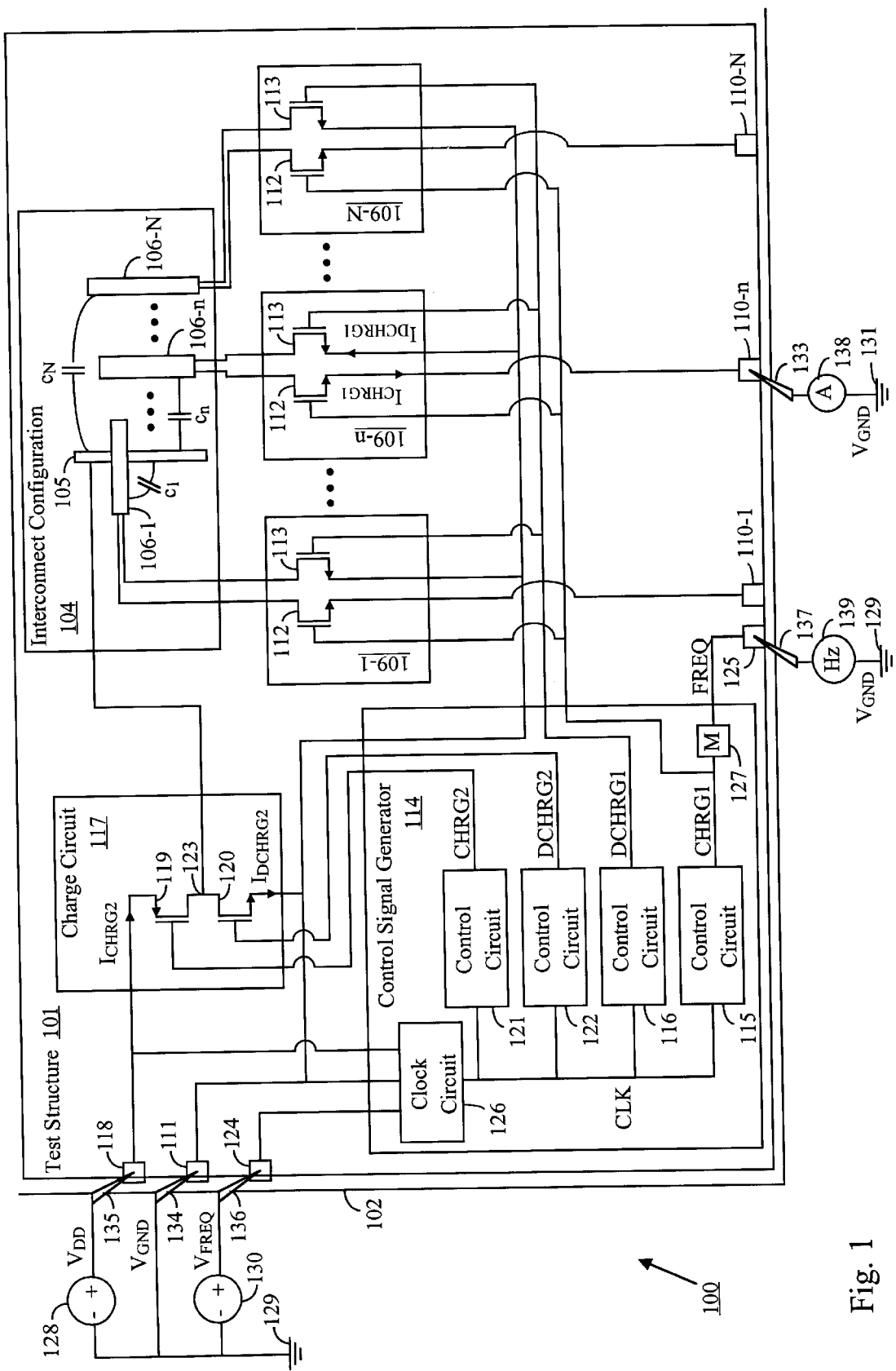
FIG. 1 is a circuit schematic of an on-chip test structure for modeling one or more target interconnect capacitances.

Referring to FIG. 1, there is shown a system 100 for modeling one or more target interconnect capacitances $c_1$ to $c_N$, where $N \geq 1$. The system comprises an on-chip test structure 101 formed on an IC chip 102. The test structure is used in conjunction with the other components of the system, namely an off-chip current meter (A) 138, an off-chip frequency meter (Hz) 139, off-chip voltage sources 128 to 131, and probes 133 to 137, to make measurements of the target interconnect capacitances. As will be described in the following sections, measurements of these target interconnect capacitances may be made and used to extract interconnect parameter measurements for circuit simulation. Test Structure Configuration The test structure 101 comprises an interconnect configuration (i.e., structure) 104 to model the target interconnect capacitances $c_1$ to $c_N$. The interconnect configuration models the same interconnect configuration that will appear in an IC. Thus, it is designed and fabricated on the IC chip 102 according to the same physical parameters and semiconductor process steps that are used in designing and fabricating the IC.

The interconnect configuration 104 comprises a test interconnect 105 and one or more target interconnects 106-1 to 106-N. These interconnects may be metal or polysilicon. Furthermore, each target capacitance $c_n$, where $1 \leq n \leq N$, exists between the test interconnect 105 and a corresponding target interconnect 106-n.

Figure 2:
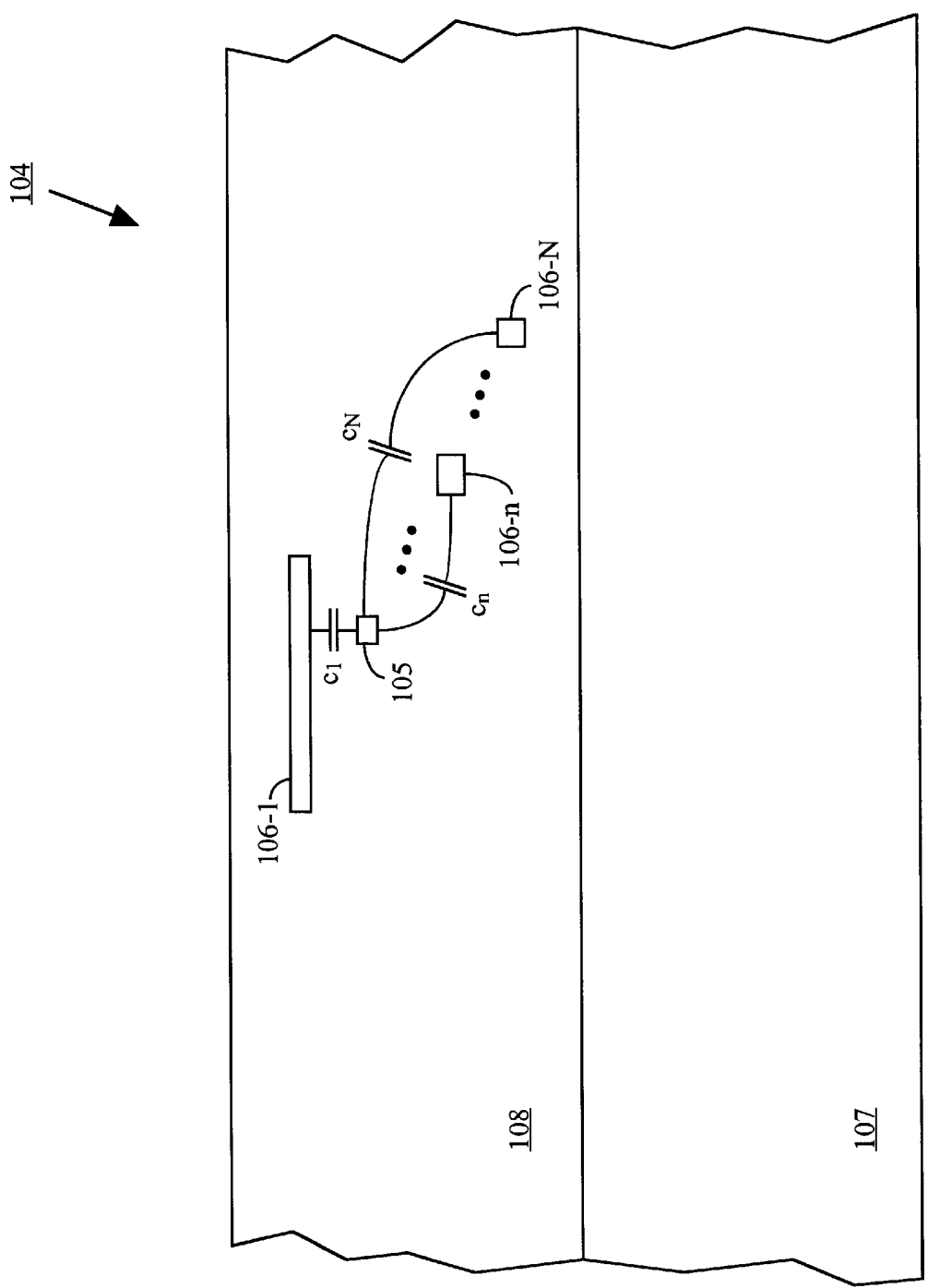
FIG. 2 shows a cross sectional layout of an interconnect configuration in the test structure of FIG. 1.

A cross sectional view of how the interconnect configuration 104 is laid out on the IC chip 102 is shown in FIG. 2. The interconnect configuration is formed on a semiconductor substrate 107 of the IC chip. In addition to the interconnects 105 and 106-1 to 106-N, the interconnect configuration also comprises an insulating material 108, such as oxide, formed on the substrate. The interconnects are patterned within the insulating material in a simple or complicated configuration or geometry. For example, the interconnect configuration may comprise only two parallel interconnects 105 and 106-1. Or, it may comprise an interconnect 105 with many overlapping, parallel, intertwined, and/or snaking interconnects 106-1 to 106-N. Each target capacitance c, is formed by the test interconnect 105, the corresponding target interconnect 106-n, and the insulating material 108 between these two interconnects.

Referring back to FIG. 1, the test structure 101 also comprises target interconnect charging circuits 109-1 to 109-N, output pads 110-1 to 110-N, and an input pad 111. The target interconnect charging circuits, output pads, and input pad are all formed on the IC chip 102 using conventional semiconductor process techniques.

For each target interconnect 106-n, there is a corresponding target interconnect charging circuit 109-n and a corresponding output pad 110-n. Each target interconnect charging circuit 109-n is configured to enable a measurement of the corresponding target interconnect capacitance $c_n$ to be made. For this purpose, it comprises two NMOS transistors 112 and 113.

The drain, gate, and source of the transistor 112 are respectively connected to the corresponding target interconnect 106-n, a target interconnect charging control circuit 115, and the corresponding output pad 110-n. The control circuit is located in a control signal generator 114 of the test structure 101. It provides a target interconnect charging control signal CHRG1 to the gate of the transistor during operation of the test structure. During this time, the output pad is connected to the local ground voltage source 131 via the current meter 138 and the probe 133 connected to the current meter. This connects the source of the transistor to the ground voltage source so that it receives the ground voltage $V_{GND}$.

Similarly, the drain, gate, and source of the other transistor 113 are respectively connected to the corresponding interconnect 106-n, a target interconnect discharging control circuit 116 in the control signal generator 114, and the input pad 111. During operation of the test structure 101, the control circuit provides a target interconnect discharging control signal DCHRG1 to the gate of the transistor. During this time, the input pad is connected to the global ground voltage source 129 with the probe 134 to receive the ground voltage $V_{GND}$. As a result, the source of the transistor is connected to the ground voltage source and receives the ground voltage $V_{GND}$.

The test structure 101 also comprises a test interconnect charging circuit 117 and an input pad 118 formed on the IC chip 102 using conventional semiconductor process techniques. The off-chip supply voltage source 128 is connected between this input pad and the global ground voltage source 129 during operation of the test structure 101. This is done with the probe 135 connected to the supply voltage source. As a result, the input pad receives a supply voltage $V_{DD}$ from the voltage source.

The test interconnect charging circuit 117 comprises a PMOS transistor 119. The source and gate of the transistor are respectively connected to the input pad 118 and a test interconnect charging control signal generator 121 in the control signal generator 114. The input pad and probe 135 connect the source of the transistor to the supply voltage source 128 during operation of the test structure 101. This provides the supply voltage $V_{DD}$ to the source of the transistor. And, during this time, the control circuit provides a test interconnect charging control signal CHRG2 to the gate of the transistor.

The test interconnect charging circuit 117 also comprises an NMOS transistor 120. The gate and the source of the transistor are respectively connected to a test interconnect discharging control circuit 122 in the control signal generator 114 and the input pad 111. During operation of the test structure 101, the control circuit provides a test interconnect discharging control signal DCHRG2 to the gate of the transistor. Since the input pad is connected to the global ground voltage source 129 with the probe 134 during this time, the source of the transistor is connected to the global ground voltage source and receives the ground voltage $V_{GND}$.

The drains of the transistors 119 and 120 are connected together and to the test interconnect 104. This connection forms a node 123 of the test interconnect charging circuit 117. The node is used to charge and discharge the test interconnect during operation of the test structure 101. The manner in which this is done is described in the section covering the operation of the test structure 101.

The control signal generator 114 and input and output pads 124 and 125 of the test structure 101 are formed on the IC chip 102 using conventional semiconductor process techniques as well. In addition to the control circuits 115, 116, 121, and 122, the control signal generator also comprises a clock circuit 126 and a frequency divider (M) 127.

The clock circuit 126 is connected to the control circuits 115, 116, 121, and 122 and the input pads 111, 118, and 124.

During operation, the clock circuit is connected to the supply and global ground voltage sources 128 and 129 with the input pads 118 and 111 and probes 135 and 134. It therefore receives the supply and ground voltages $V_{DD}$ and $V_{GND}$ and in response generates a clock signal CLK. The frequency of the clock signal is controlled with a frequency control voltage $V_{freq}$. During operation, the off-chip variable voltage source 130 is connected between the input pad 124 and the global ground voltage source 129. This is done with the probe 136 connected to the variable voltage source and connects the clock circuit to the variable voltage source to receive the frequency control voltage. In response to variations in the frequency control voltage, the clock circuit adjusts the frequency of the clock signal.

The control circuits 115, 116, 121, and 122 are each connected to the clock circuit 126 to receive the clock signal CLK. In response, the control circuits generate their respective control signals CHRG1, DCHRG1, CHRG2, and DCHRG2.

The frequency divider 127 is connected to the target interconnect charging control circuit 115 to receive the target interconnect charging control signal CHRG1. It divides the frequency $f_{CHRG1}$ of this control signal by a pre-selected factor M so that it can be measured. The frequency divider is connected to the output pad 125 to provide it with the resulting measurable frequency signal FREQ. The frequency $f_{CHRG1}/M$ of this signal is measured with the frequency meter 139 during operation of the test structure when the frequency meter is connected between this output pad and the global ground voltage source 129. This is done with the probe 137 connected to the frequency meter.

Test Structure Operation

Figure 3:
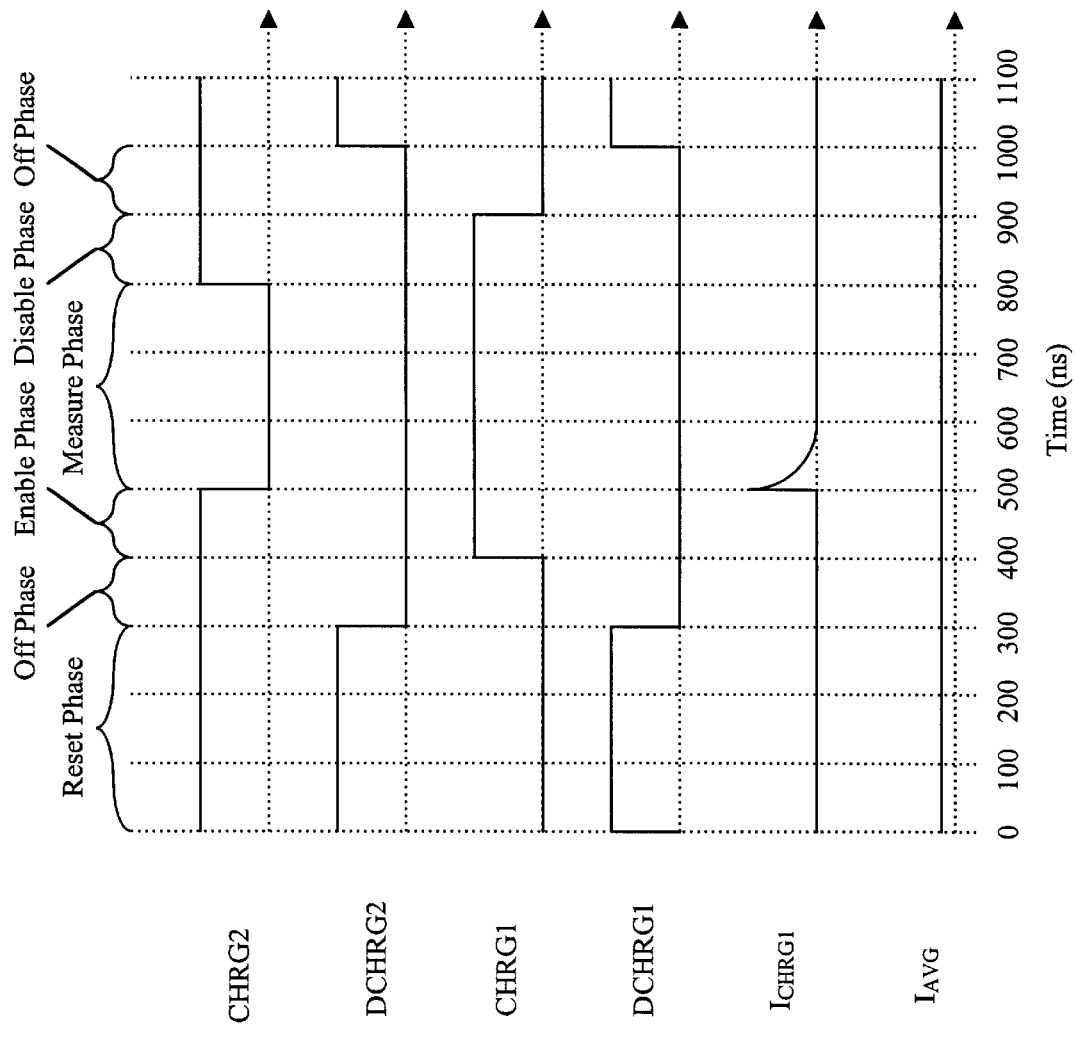
FIG. 3 provides a timing diagram of the control signals used in the test structure of FIG. 1.

The method of making a measurement of any target interconnect capacitance $c_n$ during operation of the test structure 101 will now be described with respect to FIGS. 1 and 3. Example waveforms of the control signals CHRG1, DCHRG1, CHRG2, and DCHRG2 required for making such a measurement are shown in the timing diagram of FIG. 3. Over the various phases (i.e., modes or time periods) of operation of the test structure, these control signals transition back and forth between low at 0 V (volts) and high at $V_{DD}$. As alluded to earlier, the frequency $f_{CHRG1}$ of these signals is arbitrary and can be set with the frequency control signal $V_{freq}$. In the timing diagram of FIG. 1, this frequency is 1 MHz.

During a reset phase between 0 ns and 300 ns, the test structure 101 is reset for measurement of the interconnect capacitance $c_n$. The discharge and charging control signals DCHRG2 and CHRG2 are high during this phase and respectively indicate that discharging is to occur and charging is not to occur on the test interconnect 105. In other words, only discharging is to occur. In the charging circuit 117, this turns on the transistor 120 while leaving the transistor 119 off. As a result, a discharging current $I_{DCHRG2}$ is drawn by the transistor 120 from the interconnect to the global ground voltage source 129. This removes any pre-existing charge on the interconnect.

Similarly, the discharging control signal DCHRG1 is high and the charging control signal CHRG1 is low during the reset phase and together indicate that only discharging is to occur on the corresponding interconnect 106-n. Thus, the discharging control signal indicates that discharging is to occur while the charging control signal indicates that charging is not to occur. In the corresponding target interconnect charging circuit 109-n, this turns on the transistor 113 and leaves the transistor 112 off. A discharging current $I_{DCHRG1}$ is therefore drawn by the transistor 112 from the local ground voltage source 131 to the target interconnect. Thus, any pre-existing charge on the target interconnect is also removed.

During an off phase between 300ns and 400 ns, the discharging control signals DCHRG2 and DCHRG1 are low and indicate that discharging is not to occur on the interconnects 105 and 106-n, respectively. The charging control signals CHRG2 and CHRG1 remain respectively high and low during this phase and indicate that charging is not to occur on these interconnects as well. Thus, all of the transistors 119, 120, 112, and 113 are turned off.

During an enable phase from 400 ns to 500 ns, the charging control signal CHRG1 is high and indicates that charging on the target interconnect 106-n is to occur. The charging control signal CHRG2 remains high while the discharging control signals DCHRG2 and DCHRG1 remain low. This turns on the transistor 112 and leaves the other transistors 119, 120, and 113 off. The test structure 101 is now enabled for measuring the target interconnect capacitance $c_n$.

Then, during a measure phase between 500 ns and 800 ns, the charging control signal CHRG2 is low and indicates that charging on the test interconnect 105 is to occur. The discharging control signal DCHRG2 remains low. The transistor 119 is now turned on while the transistor 120 is still off. Therefore, the transistor 119 draws a charging current $I_{CHRG2}$ from the external voltage source 128 to the test interconnect. This places a desired charge $(c_n)(V_{DD})$ on the test interconnect.

Since the interconnects 105 and 106-n are coupled together by the target interconnect capacitance $C_n$, an equal but opposite charge $-(c_n)(V_{DD})$ is induced on the target interconnect 106-n during the measure phase. The charging control signal CHRG1 is high during this time period so that the transistor 112 is kept on. As a result, a measurable charging current $I_{CHRG1}$ is drawn from the target interconnect through the current meter 138 and to the local ground voltage source 131. This places the opposite charge on the target interconnect. A measurement of this current is made with the current meter during this phase.

During a disabling phase between 800 ns and 900 ns, the charging control signals CHRG2 and CHRG1 are high while the discharging control signals DCHRG2 and DCHRG1 remain low. This turns off the transistors 119 and 120 so that the test structure 101 is disabled from placing anymore charge on the test interconnect 105. However, the transistors 112 and 113 are respectively on and off so that the measurable charging current $I_{CHRG1}$ is still being drawn from the target interconnect 106-n and measured with the current meter 138. This is done to ensure that all of the opposite charge $-(c_n)(V_{DD})$ on the target interconnect 106-n has been measured.

Then, the charging control signal CHRG2 is high and the discharge and charging control signals DCHRG2, CHRG1, and DCHRG1 are low during another off phase between 900 ns and 1000 ns. Thus, all of the transistors 119, 120, 112, and 113 are now turned off. The measurement of the measurable charging current $I_{CHRG1}$ is complete for this cycle.

The process just described is then repeated over one or more measurement cycles. Since a conventional current meter 138 is used, it provides a measurement of the average current $I_{AVG}$ for the measurable charging current $I_{CHRG1}$ according to:

$$I_{AVG} = \frac{1}{T} \int I_{CHRG1}(t) dt \qquad (1)$$

where t represents time and T is the time period of one measurement cycle. While this is all occurring, the frequency meter 139 is used to make a measurement of the frequency $f_{CHRG1}/M$ of the measure control signal in a conventional manner. From these measurements and the known values for the supply voltage $V_{DD}$ and the factor M, a measurement of the target interconnect capacitance $c_n$ can then be computed according to:

$$c_n = \frac{I_{AVG}}{(V_{DD})(f_{CHRG1}/M)(M)} \qquad (2)$$

This provides a highly accurate measurement with attofared resolution.

The method just described may be performed similarly for any of the other target interconnect capacitances $c_1, \ldots, c_{n-1}, \ldots c_{n+1}, \ldots, c_N$ in the interconnect configuration 104, regardless of their size, position, configuration, and/or geometry. Furthermore, the method may be performed serially for each target interconnect capacitance $c_n$ by appropriately connecting the current meter 138 to the corresponding measure sub-circuit 109-n. Or, it may be performed simultaneously for all of the interconnect capacitances $c_1$ to $c_N$ with corresponding current meters connected to the target interconnect charging circuits 109-n to 109-N. Thus, only one test structure 101 is required to measure all of the interconnect capacitances in this specific interconnect configuration. This minimizes the chip area required by the test structure on the IC chip 102.

Alternative Embodiments

As those skilled in the art will recognize, alternative embodiments to that shown in FIG. 1 do exist. For example, only NMOS or only PMOS transistors may be used in the charging circuit 117. Of course, this would require a corresponding inversion of one of the charge and discharge signals CHRG2 and DCHRG2. Similarly, only PMOS transistors may be used in each target interconnect charging circuit 109-n. This also would require inversion of the charge and discharging control signals CHRG1 and DCHRG1.

Furthermore, the control signal generator 114 is shown in FIG. 1 as being located on the IC chip 102. In another embodiment, it could also be located off-chip. In this case, the test structure 101 would include input pads to receive the respective control signals CHRG1, DCHRG1, CHRG2, and DCHRG2. The input pads would be formed on the IC chip using conventional semiconductor process techniques and would be connected to the respective control circuits 115, 116, 121, and 122 of the control signal generator with corresponding probes. The input pads would also be connected to the respective transistors 112, 113, 119, and 120 to provide them with the respective control signals.

In the section covering the operation of the test structure 101, it is mentioned that a measurement of the frequency $f_{CHRG2}$ of the charging control signal CHRG2 is to be made in order to make a measurement of the target interconnect capacitance $c_n$. In other embodiments, a measurement of the frequency of any one of the other control signals CHRG1, DCHRG1, and DCHRG2 can also be selected for this purpose. In this case, the corresponding control circuit 115, 116, or 122 will be connected to the frequency divider 127.

Figure 4:
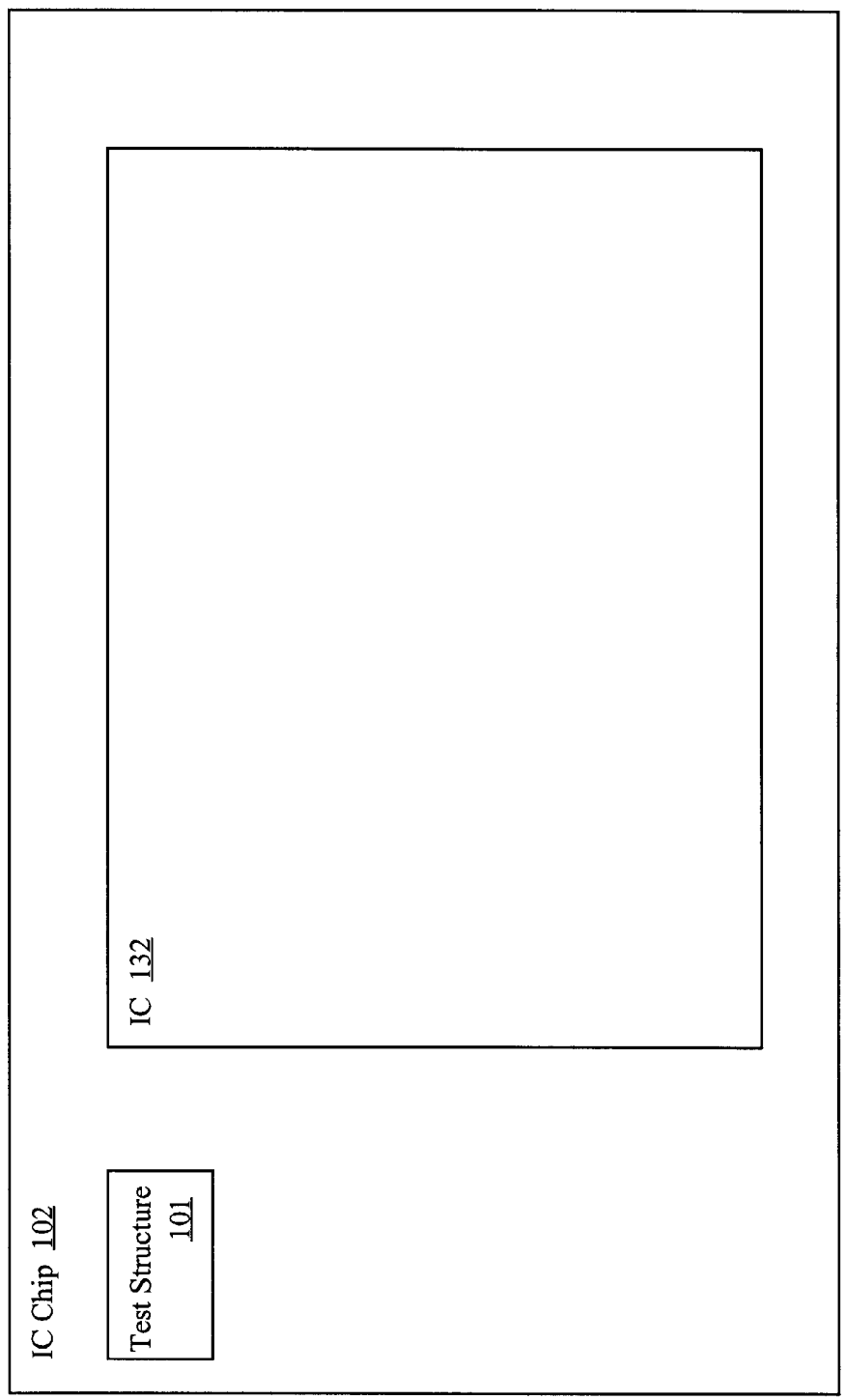
FIG. 4 shows an embodiment where the on-chip test structure of FIG. 1 is formed on an IC chip together with an IC.

As mentioned in the section covering the configuration of the test structure 101, the interconnect configuration 104 of the test structure is used to model an interconnect configuration in an IC. As shown in FIG. 4, this IC 132 may also be formed on the same IC chip 102 with the test structure 101. In this way, the IC and the test structure can be fabricated simultaneously with exactly the same physical parameters and semiconductor process steps. Moreover, the measurements of the interconnect capacitances $c_1$ to $c_N$ can be directly made by the manufacturer or a buyer of the IC chip. Alternatively, the test structure may be formed on a separate IC chip than the IC.

As will also be appreciated by those skilled in the art, the test structure 101 may be formed on the IC chip 102 with other test structures that include different interconnect configurations than that of the test structure 101. These interconnect configurations will also be formed according to the physical parameters and semiconductor process steps that are used in designing and fabricating the IC that will include them.

CONCLUSION

The invention disclosed herein comprises an improved on-chip test structure 101 and corresponding method for modeling target interconnect capacitances $c_1$ to $c_N$ of a particular interconnect configuration 104. The interconnect configuration may have a simple or complicated configuration or geometry. The use of a target interconnect charging circuit 109-n for each target interconnect 106-n enables the corresponding target interconnect capacitance $c_n$ to be measured with high accuracy and resolution. Moreover, only one test structure is required for making these measurements so that the chip area of the IC chip 102 on which it is formed is small.

The high accuracy and resolution of the measurements of the interconnect capacitances $c_1$ to $c_N$ enables interconnect parameter measurements to be accurately extracted for circuit simulations. The extracted interconnect parameter measurements include measurements of interconnect heights and widths, oxide thicknesses between interconnects, and the interconnect capacitances. The circuit simulations in which the extracted interconnect parameter measurements are used are therefore very precise.

Finally, although the present invention has been described with reference to a few specific embodiments, the description is illustrative of the invention and is not to be construed as limiting the invention. Various modifications may occur to those skilled in the art without departing from the true spirit and scope of the invention as defined by the appended claims and their equivalents.

What is claimed is:

1. A test structure formed on an IC chip for modeling a target interconnect capacitance, the test structure comprising:

an interconnect configuration formed on the IC chip and comprising a test interconnect and a target interconnect, the interconnect configuration having the target interconnect capacitance between the test and target interconnects;

a test interconnect charging circuit formed on the IC chip and connected to the test interconnect, the test interconnect charging circuit being configured to place a test charge on the test interconnect; and a target interconnect charging circuit formed on the IC chip and connected to the target interconnect, the target interconnect charging circuit being configured to draw a target interconnect charging current from the target interconnect induced by the target interconnect capacitance, whereby a measurement of the target interconnect capacitance may be computed from a measurement of the target interconnect charging current.

2. The test structure of claim 1 wherein the test interconnect charging circuit is further configured to draw a test interconnect charging current to the test interconnect to place the test charge on the test interconnect.

3. The test structure of claim 2 wherein:

the test structure has reset and measure phases of operation;

the test interconnect charging circuit is further configured to draw a test interconnect discharging current from the test interconnect during the reset phase to remove any pre-existing charge on the test interconnect and draw the test interconnect charging current to the test interconnect during the measure phase; and the target interconnect charging circuit is further configured to draw a target interconnect discharging current to the target interconnect during the reset phase to remove any pre-existing charge on the target interconnect and draw the target interconnect charging current from the target interconnect during the measure phase.

4. The test structure of claim 3 wherein:

the test interconnect charging circuit is further configured to be responsive to test interconnect charge and discharging control signals such that:

in the reset phase, the test interconnect discharging current is drawn when the test interconnect charge and discharging control signals respectively indicate that charging is not to occur and discharging is to occur;

in the measure phase the test interconnect charging current is drawn when the test interconnect charge and discharging control signals respectively indicate that charging is to occur and discharging is not to occur; and the target interconnect charging circuit is further configured to be responsive to target interconnect charge and discharging control signals such that:

in the reset phase, the target interconnect discharging current is drawn when the target interconnect charge and discharging control signals respectively indicate that charging is not to occur and discharging is to occur; and in the measure phase, the target interconnect charging current is drawn when the target interconnect charge and discharging control signals respectively indicate that charging is to occur and discharging is not to occur.

5. The test structure of claim 4 wherein the target interconnect charging circuit comprises first and second transistors connected to the target interconnect and configured to be respectively responsive to the target interconnect charge and discharging control signals such that:

in the reset phase, the first and second transistors are respectively turned on and off when the target interconnect charge and discharging control signals respectively indicate that charging is to occur and discharging is not to occur so as to draw the target interconnect charging current;

in the measure phase, the first and second transistors are respectively turned off and on when the target interconnect charge and discharging control signals respectively indicate that charging is not to occur and discharging is to occur so as to draw the target interconnect discharging current.

6. The test structure of claim 5 wherein the test interconnect charging circuit comprises third and fourth transistors connected to the test interconnect and configured to be respectively responsive to the test interconnect charge and discharging control signals such that:

in the reset phase, the third and fourth transistors are respectively turned on and off when the test interconnect charge and discharging control signals respectively indicate that charging is to occur and discharging is not to occur so as to draw the test interconnect charging current; and in the measure phase, the third and fourth transistors are respectively turned off and on when the test interconnect charge and discharging control signals respectively indicate that charging is not to occur and discharging is to occur so as to draw the test interconnect discharging current.

7. The test structure of claim 4 further comprising a control signal generator formed on the IC chip and configured to generate the test and target interconnect charging and discharging control signals, the control signal generator being connected to the test and target interconnect charging circuits to provide the test and target interconnect charging and discharging control signals thereto.

8. The test structure of claim 7 wherein the control signal generator comprises a frequency divider to divide the frequency of a selected control signal of the test and target interconnect charging and discharging control signals by a pre-selected factor to generate a frequency divided signal, whereby the measurement of the target capacitance may further be computed from a measurement of the frequency of the frequency divided signal and the pre-selected factor.

9. A test structure formed on an IC chip for modeling one or more target interconnect capacitances, the test structure comprising:

an interconnect configuration formed on the IC chip and comprising a test interconnect and one or more target interconnects, the interconnect configuration having, for each target interconnect, a corresponding target interconnect capacitance between the test interconnect and the target interconnect;

a test interconnect charging circuit formed on the IC chip and connected to the test interconnect, the test interconnect charging circuit being configured to place a test charge on the test interconnect; and one or more target interconnect charging circuits, each target interconnect charging circuit being formed on the IC chip and connected to a corresponding target interconnect, each target interconnect charging circuit being configured to draw a target interconnect charging current from the corresponding target interconnect induced by the corresponding target interconnect capacitance, whereby a measurement of the corresponding target interconnect capacitance may be computed from a measurement of the target interconnect charging current.

10. The test structure of claim 9 wherein the test interconnect charging circuit is further configured to draw a test interconnect charging current to the test interconnect to place the test charge on the test interconnect.

11. The test structure of claim 10 wherein:

the test structure has reset and measure phases of operation;

the test interconnect charging circuit is further configured to draw a test interconnect discharging current from the test interconnect during the reset phase to remove any pre-existing charge on the test interconnect and draw the test interconnect charging current to the test interconnect during the measure phase; and each target interconnect charging circuit is further configured to draw a target interconnect discharging current to the corresponding target interconnect during the reset phase to remove any pre-existing charge on the corresponding target interconnect and draw the target interconnect charging current from the corresponding target interconnect during the measure phase.

12. The test structure of claim 11 wherein:

the test interconnect charging circuit is further configured to be responsive to test interconnect charge and discharging control signals such that:

in the reset phase, the test interconnect discharging current is drawn when the test interconnect charge and discharging control signals respectively indicate that charging is not to occur and discharging is to occur;

in the measure phase the test interconnect charging current is drawn when the test interconnect charge and discharging control signals respectively indicate that charging is to occur and discharging is not to occur; and each target interconnect charging circuit is further configured to be responsive to target interconnect charge and discharging control signals such that:

in the reset phase, the target interconnect discharging current is drawn when the target interconnect charge and discharging control signals respectively indicate that charging is not to occur and discharging is to occur; and in the measure phase, the target interconnect charging current is drawn when the target interconnect charge and discharging control signals respectively indicate that charging is to occur and discharging is not to occur.

13. The test structure of claim 12 wherein each target interconnect charging circuit comprises first and second transistors connected to the corresponding target interconnect and configured to be respectively responsive to the target interconnect charge and discharging control signals such that:

in the reset phase, the first and second transistors are respectively turned on and off when the target interconnect charge and discharging control signals respectively indicate that charging is to occur and discharging is not to occur so as to draw the target interconnect charging current;

in the measure phase, the first and second transistors are respectively turned off and on when the target interconnect charge and discharging control signals respectively indicate that charging is not to occur and discharging is to occur so as to draw the target interconnect discharging current.

14. The test structure of claim 13 wherein the test interconnect charging circuit comprises third and fourth transistors connected to the test interconnect and configured to be respectively responsive to the test interconnect charge and discharging control signals such that:

in the reset phase, the third and fourth transistors are respectively turned on and off when the test interconnect charge and discharging control signals respectively indicate that charging is to occur and discharging is not to occur so as to draw the test interconnect charging current; and in the measure phase, the third and fourth transistors are respectively turned off and on when the test interconnect charge and discharging control signals respectively indicate that charging is not to occur and discharging is to occur so as to draw the test interconnect discharging current.

15. The test structure of claim 12 further comprising a control signal generator formed on the IC chip and configured to generate the test and target interconnect charging and discharging control signals, the control signal generator being connected to the test and one or more target interconnect charging circuits to provide the test and target interconnect charging and discharging control signals thereto.

16. The test structure of claim 15 wherein the control signal generator comprises a frequency divider to divide the frequency of a selected control signal of the of the test and target interconnect charging and discharging control signals by a pre-selected factor to generate a frequency divided signal, whereby the measurement of the target capacitance may further be computed from a measurement of the frequency of the frequency divided signal and the pre-selected factor.

17. An IC chip comprising a test structure formed on the IC chip for modeling a target interconnect capacitance, the test structure comprising:

an interconnect configuration formed on the IC chip and comprising a test interconnect and a target interconnect, the interconnect configuration having the target interconnect capacitance between the test and target interconnects;

a test interconnect charging circuit formed on the IC chip and connected to the test interconnect, the test interconnect charging circuit being configured to place a test charge on the test interconnect; and a target interconnect charging circuit formed on the IC chip and connected to the target interconnect, the target interconnect charging circuit being configured to draw a target interconnect charging current from the target interconnect induced by the target interconnect capacitance, whereby a measurement of the target interconnect capacitance may be computed from a measurement of the target interconnect charging current.

18. The IC chip of claim 17 further comprising an IC formed on the IC chip that includes an interconnect configuration that is the same as the interconnect configuration of the test structure.

19. The IC chip of claim 17 wherein the test interconnect charging circuit is further configured to draw a test interconnect charging current to the test interconnect to place the test charge on the test interconnect.

20. The IC chip of claim 19 wherein:

the test structure has reset and measure phases of operation;

the test interconnect charging circuit is further configured to draw a test interconnect discharging current from the test interconnect during the reset phase to remove any pre-existing charge on the test interconnect and draw the test interconnect charging current to the test interconnect during the measure phase; and the target interconnect charging circuit is further configured to draw a target interconnect discharging current to the target interconnect during the reset phase to remove any pre-existing charge on the target interconnect and draw the target interconnect charging current from the target interconnect during the measure phase.

21. The IC chip of claim 20 wherein:

the test interconnect charging circuit is further configured to be responsive to test interconnect charge and discharging control signals such that:

in the reset phase, the test interconnect discharging current is drawn when the test interconnect charge and discharging control signals respectively indicate that charging is not to occur and discharging is to occur;

in the measure phase the test interconnect charging current is drawn when the test interconnect charge and discharging control signals respectively indicate that charging is to occur and discharging is not to occur; and the target interconnect charging circuit is further configured to be responsive to target interconnect charge and discharging control signals such that:

in the reset phase, the target interconnect discharging current is drawn when the target interconnect charge and discharging control signals respectively indicate that charging is not to occur and discharging is to occur; and in the measure phase, the target interconnect charging current is drawn when the target interconnect charge and discharging control signals respectively indicate that charging is to occur and discharging is not to occur.

22. The IC chip of claim 21 wherein the target interconnect charging circuit comprises first and second transistors connected to the target interconnect and configured to be respectively responsive to the target interconnect charge and discharging control signals such that:

in the reset phase, the first and second transistors are respectively turned on and off when the target interconnect charge and discharging control signals respectively indicate that charging is to occur and discharging is not to occur so as to draw the target interconnect charging current;

in the measure phase, the first and second transistors are respectively turned off and on when the target interconnect charge and discharging control signals respectively indicate that charging is not to occur and discharging is to occur so as to draw the target interconnect discharging current.

23. The IC chip of claim 22 wherein the test interconnect charging circuit comprises third and fourth transistors connected to the test interconnect and configured to be respectively responsive to the test interconnect charge and discharging control signals such that:

in the reset phase, the third and fourth transistors are respectively turned on and off when the test interconnect charge and discharging control signals respectively indicate that charging is to occur and discharging is not to occur so as to draw the test interconnect charging current; and in the measure phase, the third and fourth transistors are respectively turned off and on when the test interconnect charge and discharging control signals respectively indicate that charging is not to occur and discharging is to occur so as to draw the test interconnect discharging current.

24. The IC chip of claim 21 further comprising a control signal generator formed on the IC chip and configured to generate the test and target interconnect charging and discharging control signals, the control signal generator being connected to the test and target interconnect charging circuits to provide the test and target interconnect charging and discharging control signals thereto.

25. The IC chip of claim 24 wherein the control signal generator comprises a frequency divider to divide the frequency of a selected control signal of the test and target interconnect charging and discharging control signals by a pre-selected factor to generate a frequency divided signal, whereby the measurement of the target capacitance may further be computed from a measurement of the frequency of the frequency divided signal and the pre-selected factor.

* * * * *